United States Patent
Smith et al.

(10) Patent No.: US 7,697,580 B2
(45) Date of Patent: Apr. 13, 2010

(54) MONITORING OF A LASER SOURCE WITH FRONT AND REAR OUTPUT PHOTODETECTORS TO DETERMINE FRONTAL LASER POWER AND POWER CHANGES OVER LASER LIFETIME

(75) Inventors: Robert W. Smith, Sonoma, CA (US); Alan C. Nilsson, Mountain View, CA (US)

(73) Assignee: Infinera Corporation, Sunnyvale, CA (US)

( * ) Notice: Subject to any disclaimer, the term of this patent is extended or adjusted under 35 U.S.C. 154(b) by 648 days.

(21) Appl. No.: 10/961,857

(22) Filed: Oct. 8, 2004

(65) Prior Publication Data
US 2005/0084202 A1    Apr. 21, 2005

Related U.S. Application Data

(63) Continuation-in-part of application No. 10/267,330, filed on Oct. 8, 2002, now Pat. No. 7,079,715, and a continuation-in-part of application No. 10/317,935, filed on Dec. 11, 2002, and a continuation-in-part of application No. 10/267,331, filed on Oct. 8, 2002, now Pat. No. 7,283,694.

(60) Provisional application No. 60/511,226, filed on Oct. 15, 2003.

(51) Int. Cl.
  *H01S 3/13* (2006.01)
(52) U.S. Cl. .............................. 372/29.021; 372/29.011
(58) Field of Classification Search ............ 372/29.011, 372/29.021
See application file for complete search history.

(56) References Cited

U.S. PATENT DOCUMENTS

| | | |
|---|---|---|
| 4,385,387 A | 5/1983 | Trimmel |
| 5,123,024 A | 6/1992 | Dowd et al. |
| 5,383,208 A | 1/1995 | Queniat et al. |
| 5,534,996 A | 7/1996 | Mori et al. |

(Continued)

OTHER PUBLICATIONS

Marko Erman et al., "Monolithic Integration of a GaInAs p-i-n Photodiode and an Optical Waveguide: Modeling and Realization Using Chloride Vapor Phase Epitaxy," Journal of Lightwave Technology, vol. 6, No. 3, Mar. 1988, pp. 399-412.

*Primary Examiner*—Minsun Harvey
*Assistant Examiner*—Marcia A. Golub
(74) *Attorney, Agent, or Firm*—W. Douglas Carothers, Jr.; David L. Soltz

(57) ABSTRACT

A power monitoring and correction to a desired power level of a laser or group of lasers utilizes two photodetectors which are employed to accurately determine the amount of output power from the front end or "customer" end of a laser or a plurality of such lasers. During power detection, which may be accomplished intermittently or continuously, the laser is modulated with a tone of low frequency modulation. One photodetector at the rear of the laser is employed to detect the DC value of the frequency tone, i.e., a value or number representative of the AC peak-to-peak swing, amplitude or modulation depth of the tone. Also, the rear photodetector may be employed to determine the optical modulation index (OMI). In either case, these values may be employed in a closed loop feedback system to adjust or otherwise calibrate the value of the low tone frequency relative to the total desired bias current applied to the laser. A front photodetector is employed to receive a portion of the total output of the laser, or of each laser, and the average output power of the laser, or of each laser, is determined from already knowing the optical modulation index (OMI) via the rear photodetector. Thus, by measuring and/or calibrating the laser OMI with the use of a rear photodetector, the average output power from the front end output can be unambiguously determined from detection of the AC peak-to-peak swing or amplitude of the low frequency tone received via the front photodetector.

8 Claims, 4 Drawing Sheets

U.S. PATENT DOCUMENTS

| | | |
|---|---|---|
| 5,847,856 A * | 12/1998 | Imai et al. .................. 398/195 |
| 5,850,409 A | 12/1998 | Link |
| 6,016,326 A | 1/2000 | Claisse et al. |
| 6,271,945 B1 | 8/2001 | Terahara |
| 6,282,361 B1 | 8/2001 | Nishimura et al. |
| 6,324,197 B1 | 11/2001 | Suda |
| 6,414,767 B1 | 7/2002 | Blair et al. |
| 6,449,077 B1 | 9/2002 | Broutin et al. |
| 6,459,716 B1 | 10/2002 | Lo et al. |
| 6,501,773 B1 | 12/2002 | Volz et al. |
| 6,556,321 B1 | 4/2003 | Milton et al. |
| 2002/0196821 A1 | 12/2002 | Jang et al. |
| 2003/0067947 A1 | 4/2003 | Zhang et al. |
| 2003/0095736 A1 | 5/2003 | Kish, Jr. et al. |
| 2004/0067006 A1 | 4/2004 | Welch et al. |
| 2004/0090659 A1 | 5/2004 | Zhang et al. |

* cited by examiner

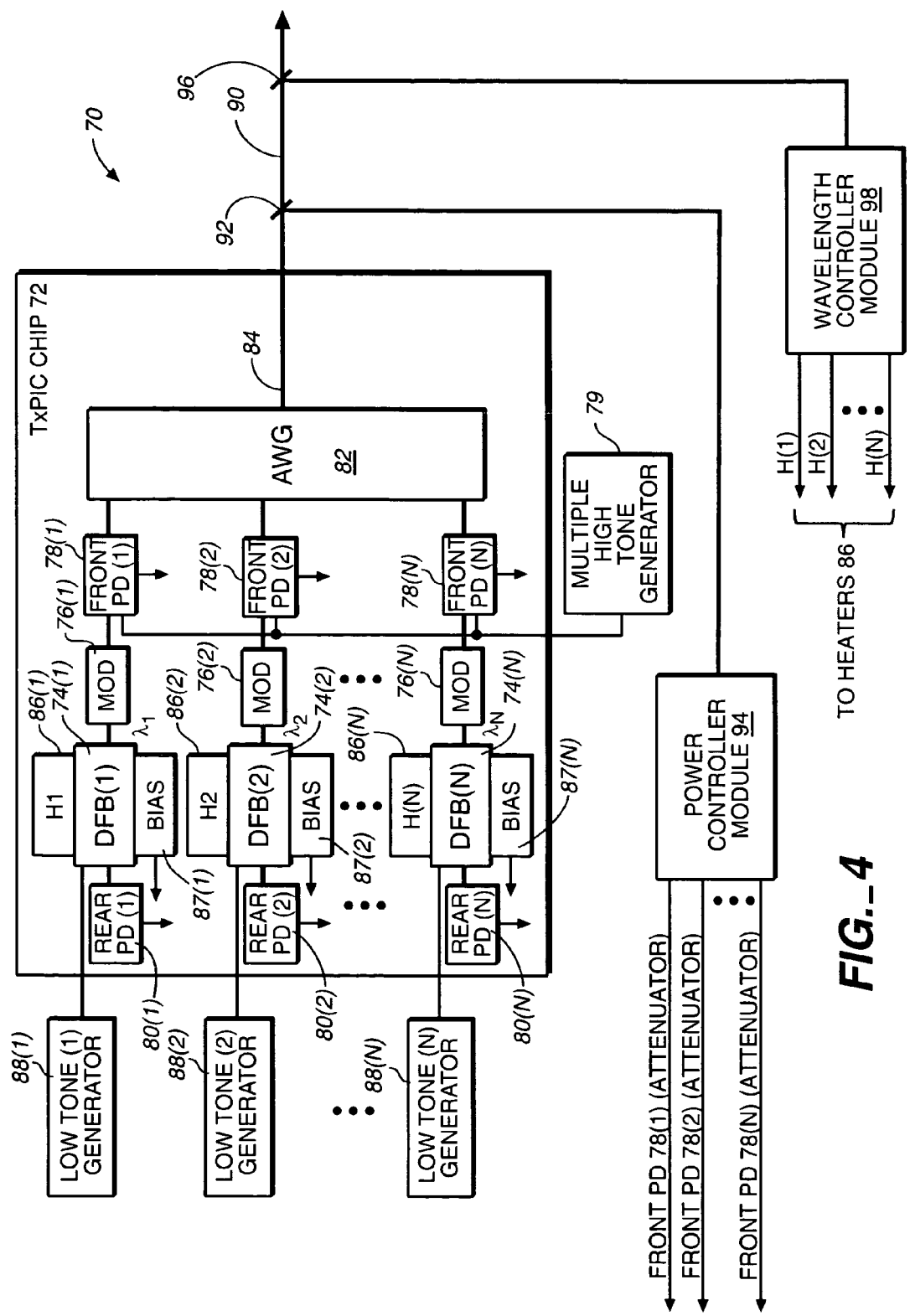
FIG._4

MONITORING OF A LASER SOURCE WITH FRONT AND REAR OUTPUT PHOTODETECTORS TO DETERMINE FRONTAL LASER POWER AND POWER CHANGES OVER LASER LIFETIME

REFERENCE TO RELATED APPLICATION

This application claims priority of U.S. provisional patent application Ser. No. 60/511,226, filed Oct. 15, 2003. In addition, this application is a continuation-in-part of U.S. patent application Ser. No. 10/267,330, filed Oct. 8, 2002 now U.S. Pat. No. 7,079,715, and entitled, TRANSMITTER PHOTONIC INTEGRATED CIRCUIT (TxPIC) CHIP ARCHITECTURES AND DRIVE SYSTEMS AND WAVELENGTH STABILIZATION FOR TxPICs, published on May 22, 2003 as Pub. No. US2003/0095736A1; a continuation-in-part of U.S. patent application Ser. No. 10/317,935, filed Dec. 11, 2002 and entitled, TRANSMITTER PHOTONIC INTEGRATED CIRCUIT (TxPIC) CHIPS, published on Apr. 8, 2004 as Pub. No. US2004/0067006A1; and a continuation-in-part of U.S. patent application Ser. No. 10/267,331, filed Oct. 8, 2002 now U.S. Pat. No. 7,283,694 and entitled, TRANSMITTER PHOTONIC INTEGRATED CIRCUITS (TxPIC) AND OPTICAL TRANSPORT NETWORKS EMPLOYING TxPICs, published on May 22, 2003 as Pub. No. US2003/0095737A1, all of these patent applications are commonly assigned to the assignee herein and also are incorporated herein by their reference.

BACKGROUND OF THE INVENTION

1. Field of Invention

This invention relates to the monitoring and detecting of optical power from a laser or laser source or from multiple lasers or laser sources such as in a laser array and, more particularly, to the monitoring and detecting accurately the front or "customer" end output power from a laser or lasers employing two photodetectors (PDs). As used throughout this description, the terms, "photodetector" or "photodetectors" may also be respectively abbreviated as "PD" or "PDs". The invention has application to both CW (continuous wave) operated lasers with their outputs coupled to an external modulator or modulators and to directed modulated lasers (DMLs). As used herein, "modulated source" or "modulated sources" means either a directly modulated laser (DML) or a CW operated laser whose output is coupled to an external modulator (EML).

2. Description of the Related Art

For many years, semiconductor lasers have been mounted in modules or packages with their back facet outputs exposed to a photodetector, such as a PIN photodiode, also positioned within the module, so that the photodetector receives a small amount of the laser output from its back facet and provides a photocurrent which is converted into a voltage and, through signal processing, is employed to control the output power of the laser over time. It is well known to employ a feedback loop circuit to control the power output of a semiconductor laser by directing a portion of the light emitted by the laser to a photodetector to produce a current which is compared to a reference to provide an error signal, which, in some cases, may be integrated over time to produce a voltage or other representative value which is employed to control the bias current to the laser in order to maintain a constant output power from the laser over time. Such a system is shown in U.S. Pat. No. 5,123,024 where a communication semiconductor laser is also directly modulated, i.e., it functions as a DML. Also, such photodetectors can be integrated with the laser and in proximity to its output facet to monitor the output power of the laser as seen, for example, in U.S. Pat. No. 6,459,716. In other cases, a rear facet photodetector and front facet photodetector can be employed which receive a small percentage of the output power of the laser and the PDs can be employed in combination to provide for accurate power monitoring without the influence of optical crosstalk caused, for example, by ASE in connection with the pumping of an EDFA as seen, for example, in U.S. Pat. No. 5,847,856. Other power monitoring and control systems for lasers are shown in FIGS. 1A and 8A of U.S. Pat. No. 6,501,773 and FIG. 6 of U.S. Pat. No. 5,383,208. Since laser power versus current characteristics as well as laser operating wavelength change with laser operating or ambient temperature as well as with aging, these monitoring and control systems are employed to maintain the output power as well as the operational wavelength of the laser at a constant value. With an ambient temperature increase, the laser threshold increases and alters the output power at a given bias current. Also, the current threshold of the semiconductor laser increases with age to end-of-life and the power output decreases with age to end-of-life which is clearly illustrated in FIGS. 3 and 4 of U.S. Pat. No. 5,383,208, supra. Thus, it is common to detect the laser power with a photodetector and employ a closed loop feedback circuit to provide a laser bias current that provides the desired output power of the semiconductor laser over its lifetime.

It is also known in the art to employ low frequency tones for applications different from use in connection with direct power monitoring. For example, in U.S. Pat. No. 6,016,326, two tones of the same frequency, but out of phase by 180 degrees, are employed to maintain the bias of a direct modulated laser (DML) at the laser threshold. One pilot tone is applied to the data modulation drive current sources and the other pilot tone is applied to the laser bias current source. A photodetector detects a portion of the laser output and generates a photocurrent from the laser ASE which is used to alter the laser bias current to be at the desired laser threshold. Also, pilot tones have been superimposed on a data modulation signal employed to directly modulate the semiconductor laser to set the extinction ratio of the DML as disclosed in U.S. Pat. No. 5,850,409. Also, such low frequency tones have been employed for tagging different laser sources so that each source can be identified in a tapped portion of a multiplexed or optical channel group (OCG) signal comprising the combined modulated wavelength channel signals in the optical transmitter output. The tagging is for the purposes of pre-emphasis or power equalization across the array of discrete channel laser sources operating at different wavelengths as depicted in FIG. 13 of U.S. Pat. No. 6,271,945. In yet another application disclosed in U.S. Pat. No. 6,556,321, as seen in FIGS. 11 and 12, low frequency modulated tones in the kilohertz range are employed to carry maintenance data in an optical transmission network via one or more transmitter semiconductor lasers along with high frequency payload data in the gigahertz range.

What is needed, however, is a way to accurately determine the output power from the front facet output or "customer end" of a laser transmitter employed in an optical communication system or network.

OBJECTS OF THE INVENTION

Therefore, it is an object of the present invention to overcome the aforementioned problems.

It is another object of this invention to provide a means to accurately determine front end output power of a laser or an array of lasers using in combination a front and a rear photodetector (PD).

It is a further object of this invention to provide a way to accurately determine the power from the front end of a optical communication laser in the presence of other optical components and waveguides integrated or provided in the optical signal path or channel from the front of the laser front end to determine relative laser output power due to laser aging and optically changing characteristics or due optical nonlinearities presented by the other components and waveguides in the optical signal path or channel.

SUMMARY OF THE INVENTION

According to this invention, a power monitoring and/or correction utilizes two photodetectors (PDs) which are employed to accurately determine the amount of power from the front end or "customer" end of a laser or a plurality of lasers, whether they are discreet devices, an integrated array of such devices or formed in a monolithic photonic integrated circuit (PIC) chip with other optical or electro-optic components, for example, such as electro-optic modulators, semiconductor optical amplifiers (SOAs), variable optical attenuators (VOAs), or photodetectors (PDs). During power detection, which may done intermittently or continuously, the laser is modulated with a tone comprising a low frequency modulation. One PD at the rear facet of the laser is employed to detect the DC value of the frequency tone, i.e., the DC value or other value or number representative of the AC peak-to-peak swing, amplitude or modulation depth. Also, the rear PD may be employed to determine the optical modulation index (OMI). In either case, these values may be employed in a closed loop feedback system to adjust or otherwise calibrate the value of the low tone frequency relative to the total desired bias current applied to a laser. A front PD is employed to receive the total output of the laser, or of each laser, and the average output power of the laser, or of each laser, is determined from already knowing the optical modulation index (OMI) or the modulation depth via the rear PD. Thus, by measuring the OMI with the use of a rear detector, the average output power from the front output can be unambiguously determined from detection of the AC peak-to-peak swing or modulation depth of the low frequency tone received at the front PD. The front PD may be positioned adjacent to the front or "customer" end of the laser, or each laser, along with other optical or electro-optic components positioned in the laser output path, or may be positioned adjacent to the final output of the laser, or of all the lasers, to receive a portion of that output.

Also, according to this invention, a method is provided for determining output power of a laser particularly where the output power from a front end of the laser is not the same as the output power from a rear end of the laser. The steps of the method include modulating the laser with a frequency tone superimposed on a bias current to the laser, detecting the output power with a first photodetector providing s first detection signal, determining a first optical attribute from the first detected signal, detecting the output power from the laser front end with a second photodetector providing a second detection signal, determining a second optical attribute from the second detection signal, and employing the first and second optical attributes to determine the average output power from the front end of the laser. In one case, the first optical attribute may be the modulation depth of the frequency tone determined from the first detection signal and the second optical attribute may also be the modulation depth determined from the second detection signal. In another case, the first optical attribute may be the optical modulation index (OMI) of the frequency tone determined from the first detection signal and the second optical attribute may be the modulation depth determined from the second detection signal.

Further, according to this invention, an integrated array of lasers, such as in a laser bar or formed in an OCG in a photonic integrated circuit (PIC), where optical channel signals may be individually modulated with a different low frequency tone or sequentially with a single low frequency tone wherein a discrete or integrated rear PD is employed to receive light from the back facet of the laser to determine an optical attribute of the laser through optical detection of the low frequency tone. The calculated or calibrated optical attribute may be used in signal processing with the aid of a front PD to determine the optical channel power by monitoring the separate strength of the low frequency tone or tones received by the front PD and electrically processed in combination with the optical attribute determined with the respective rear PDs of each laser to determine the actual average output power of a laser in a sequential manner across a laser array or concurrently for all the lasers by determining the strength value of each respective channel tone. The front PD or PDs may be internal of the laser array or PIC or may be external of the laser array or PIC combined output where a portion of the output is split or tapped for the purpose of power monitoring, detection and correction of such an optical attribute.

The determined optical attribute mentioned above may be the average value of the AC peak-to-peak swing or amplitude of the low frequency tone to the total value of the power or bias current applied to drive the laser or may be the OMI value which is determined from the ratio of the AC peak-to-peak swing, amplitude or modulation depth over the total DC value of the input to the laser, which is explained more detail later on.

The accurate measurement of the output power from the front facet of a semiconductor laser or an array of such lasers integrated on a single substrate, for example, is provided without the being affected by nonlinear optical effects or signal noise in the optical output power. A laser, or a laser in an array of such lasers, is modulated with a low frequency tone at a desired DC bias level providing a desired output power level from the laser front facet where the value of the low frequency tone is a predetermined percentage or modulation depth of the total desired DC bias level for operation of the laser providing for a predetermined light output power. A front facet or first photodetector is provided in, or tapped from, the optical path of the laser front facet output to receive a portion of the optical signal output. A back facet or second photodetector is provided at the laser back facet output to receive a portion of the back facet output. The detected output from the laser back facet is employed to provide feedback to a low frequency tone modulator circuit indicative of the accuracy of the predetermined percentage or modulation depth and make necessary corrections through a closed loop feedback system that maintains the effective modulation depth of the low frequency tone to be maintained at the predetermined percentage of the total desired DC bias level. The detected output from the laser front facet is employed to convert the low frequency tone to a DC value or other measured value or number which is employed to determine of the total output power from the laser front facet since this measured tone value is a maintained, predetermined percentage or modulation depth of the total desired DC bias level provided to the laser. Since the measured value of the low tone frequency determined at the rear facet PD is directly proportional to total output power of the laser, the actual output power emanating from the laser front facet can be readily determined from this measured tone value or from the calculated optical modulation index (OMI) using this measured tone value in the absence of any extraneous effects, such as, insertion losses or nonlinear effects associated with the laser output or other optical noise and insertion losses.

This invention also has application to array of integrated semiconductor lasers in a monolithic transmitter photonic integrated circuit (TxPIC) chip. Such a TxPIC chip comprises an array of N semiconductor lasers each formed in an optical waveguide of an array of optical waveguides and operating at a different wavelength and providing a respective light output; an array of N semiconductor electro-optic modulators integrated on the same chip, one each in an optical waveguide of the waveguide array to receive the respective light output of a laser to provide a modulated output comprising a channel signal, all of the channel signals together representative of a plurality of wavelengths on a wavelength grid, which can be a proprietary wavelength grid having equal or unequal channel spacings or a predetermined or standardized wavelength grid; an optical combiner integrated on the same chip, the input of the optical combiner coupled to each of the optical waveguides of the waveguide array to receive the modulated channel signals from the modulators and combined them into a multiplexed output signal on an optical waveguide output from the chip. Further, a first array of photodetectors are integrated on the chip with each photodetector optically coupled in an array channel waveguide between a laser and its corresponding modulator or optically coupled in an array waveguide after each of the modulators to receive a front facet output from the lasers or a single PD associated with chip output comprising the multiplexed or optical channel group (OCG) output signal and a second array of photodetectors, one for each of the lasers, and optically coupled to receive a respective back facet output from a laser. The second array of photodetectors may be separate from or integrated on a PIC chip. Circuitry is provided to sequentially modulate each of the lasers with a low frequency tone or modulate each of the lasers with a different frequency tone. Circuitry is provided to employ the photodetector output from each of the first array photodetectors or single photodetector, as the case may be, in the presence of the low frequency tone modulation of each laser to calibrate a DC value of the low frequency tone to be a predetermined percentage of a desired DC bias level applied and, therefore, the desired output power for a respective laser. Circuitry is further provided to employ photodetector output from each of the second array photodetectors in the presence of the low frequency tone modulation of its respective laser to determine a DC value of the low frequency tone in the laser rear facet output which is indicative of an optical attribute of the laser output and, in turn, is employed relative to the front photodetector or photodetectors to determine of the actual output power of each laser.

In the embodiments of this invention, the lasers may be, for example, DFB lasers or DBR lasers. The electro-optic modulators may be, for example, Mach-Zehnder modulators or electro-absorption modulators. The photodetectors (PDs) may be, for example, avalanche photodiodes or PIN photodiodes. An optical combiner, in the case of a PIC which includes a plurality of laser sources operating at different transmission wavelengths, which may be a free space combiner or a wavelength selective combiner or multiplexer. Examples of a free space combiner are a power coupler, star coupler, MMI coupler or any such optical coupler which includes at least one multimodal coupled region. Examples of a wavelength selective combiner are an Echelle grating or an arrayed waveguide grating (AWG), a cascaded Mach-Zehnder interferometer or a quasi-wavelength selective star coupler. Details of such TxPIC chips may be found in U.S. patent application Ser. No. 10/267,331, filed Oct. 8, 2002, supra.

Other objects and attainments together with a fuller understanding of the invention will become apparent and appreciated by referring to the following description and claims taken in conjunction with the accompanying drawings. The drawings are not necessarily to scale so that emphasis instead is placed on the principals and features of the invention.

BRIEF DESCRIPTION OF THE DRAWINGS

In the drawings wherein like reference symbols refer to like parts:

FIG. 4 is a more detailed schematic illustration of a further embodiment of this invention relative to a TxPIC chip having an integrated array of laser diodes.

DETAILED DESCRIPTION OF THE INVENTION

This invention relates to measuring the average optical output power from a laser front facet, albeit that the output power from the front facet of the laser may not be the same as from the rear facet because of various factors, such as, difference in aging properties of the front facet versus the rear facet, such as due particularly to the aging of facet coatings applied to these facets, as well as nonlinearities and other impairments or phenomena invoked on the front facet light due to the optical loss, optical scattering or other optical characteristics of other optical components or structures in the optical output waveguide channel or path from the front facet of the laser. Examples of the latter in the case of discrete laser diodes may be aligned optical components such as lens, couplers, modulators, photodetectors and coupling optical fibers or in the case of integrated laser diodes, such as in photonic integrated circuits, integrated modulators, photodetectors, VOAs, SOAs, optical couplers and waveguides. According to this invention, calculating the average power output from the laser diode front facet is accomplished by employing at least one front facet PD to receive a portion of the output from the laser. A measured value of a low frequency tone amplitude or the calculated optical modulation index from the light received at a rear facet PD is employed to determine the average output power from the front facet of the laser exclusive of any nonlinearities, optical noise or optical losses. The optical modulation index (OMI) is the ratio of the amplitude of the modulation frequency tone to the average power of the output of the laser. Said another way, the optical modulation index (OMI) is the ratio of the average power of the AC peak-to-peak swing of the laser tone modulation signal divided by the average DC output of the laser or $$OMI = \frac{P_M}{P_T} \times 100(\%),  \quad (1)$$

where OMI is the Optical Modulation Index, $P_T$ is the average output power of the laser and $P_M$ is the frequency tone signal power.

Figure 1:
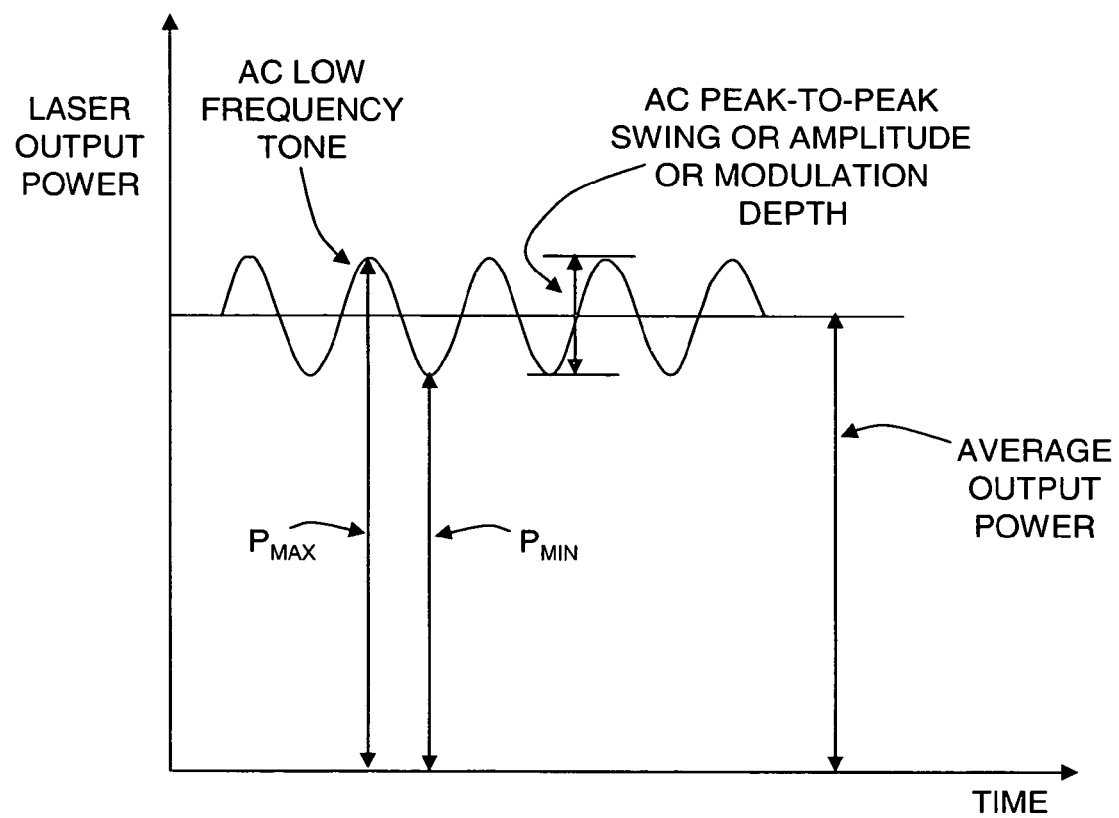
FIG. 1 is a graphic illustration of a tone modulation frequency superimposed with a DC bias to be applied to drive a laser diode.

Thus, it can be said that the optical modulation index (OMI) of the light being measured is the ratio of the amplitude of modulated signal to the average optical power present in the laser output in the absence of such a modulated signal. As seen in FIG. 1, there is shown a representation of the light output power of a laser versus time. The AC peak-to-peak swing is the amplitude of the low frequency tone. Note that for each half cycle of the tone frequency, the power has a peak maximum ($P_{MAX}$) and a peak minimum ($P_{MIN}$) where the power gain in the positive half cycle of the frequency is equal to the power loss in the negative half cycle of a frequency cycle so that the average power output over time from the laser will remain constant. To be noted also is that the peak-to-peak amplitude of the frequency tone on the laser must be small enough to remain well above the threshold of the laser. The average power can be determined from the amplitude of the AC peak-to-peak swing over two times the average power output of the laser which is equivalent to the amplitude value of the AC portion divided by the average output power. Therefore, upon viewing of FIG. 1, it can be seen that the average power from the laser is equal to $P_{MAX}$ minus $P_{MIN}$ over $P_{MAX}$ plus $P_{MIN}$ or $$\text{Average Power} = \frac{P_{MAX} - P_{MIN}}{P_{MAX} + P_{MIN}}. \qquad (2)$$

The low frequency tone signal or signals, for example, may be a sinusoidal or square wave.

Thus, the average power is determined by employing the optical modulation index (OMI) where the OMI is predetermined employing the rear facet PD relative to a particular laser where the rear output of the laser does not involve a complicated optical path. In o0ther words, the PD is optically coupled directly to the back facet output of the laser without any intervening optical component or other optical structure in the optical path between these two optical components. In essence, then, the back facet PD may be a calibrating PD and is employed to measure the average photocurrent or a signal proportional to the average photocurrent and the amplitude value of the AC peak-to-peak swing of the frequency tone modulation signal applied to the laser. The OMI is calculated by dividing the AC peak-to-peak swing or amplitude value by the total DC value of the laser power.

If the average power of the laser drops over its lifetime, the amplitude value of the AC peak-to-peak swing of the frequency tone will also drop as detected via the back facet. However, knowing the OMI from the back facet PD, this value can be employed with the DC value of the frequency tone received at the front facet PD to accurately determine the average output power of the laser. The average output power is the product of the predetermined OMI value from the back facet PD and the average power based upon the photocurrent received by the front facet PD. In other words, the DC average power at the front facet PD can be determined based upon the DC value of the front facet, detecting the AC peak-to-peak swing or amplitude, times the known OMI calibrated from the back facet PD.

Figure 2:
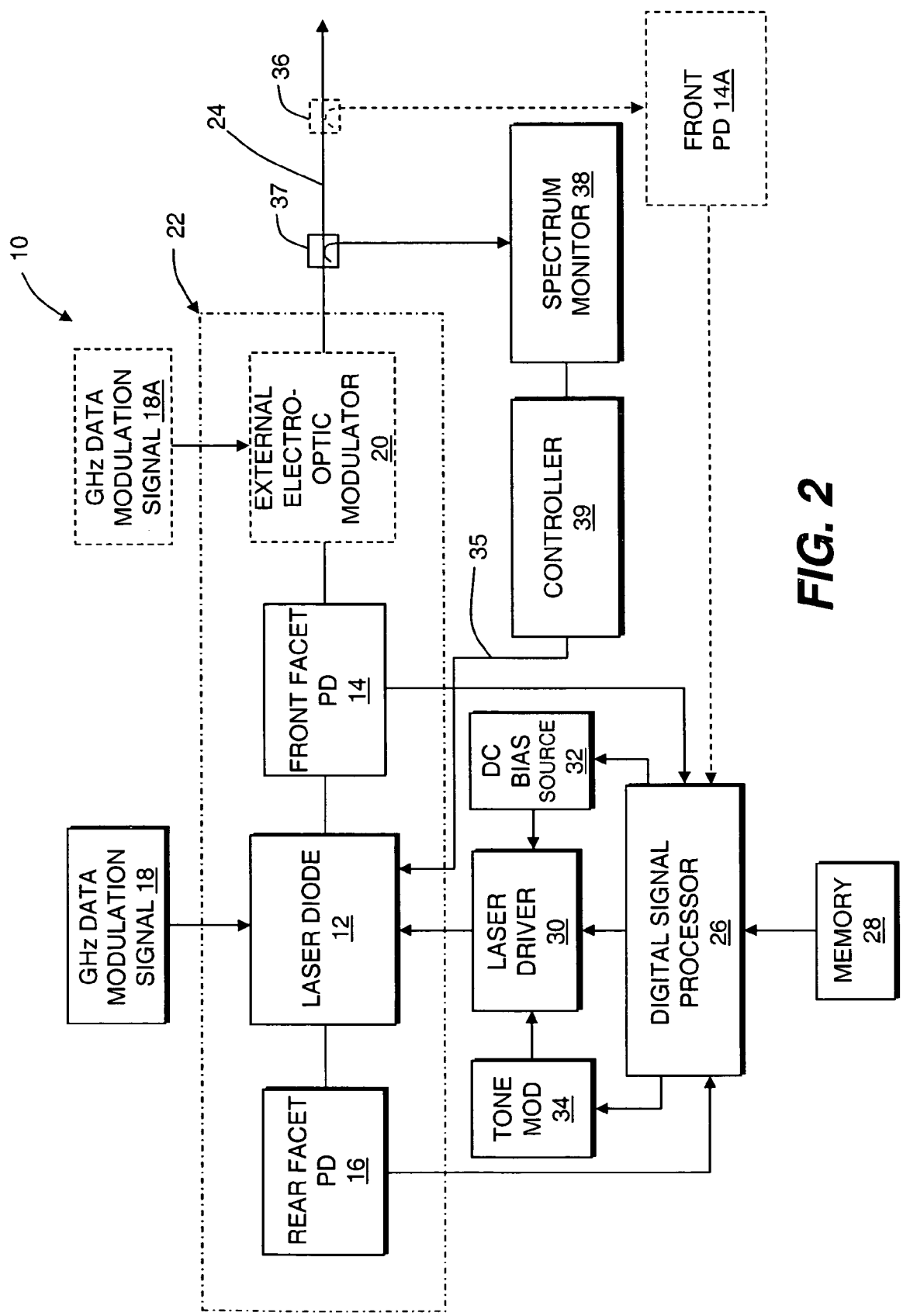
FIG. 2 is a schematic illustration of a generic application of this invention for applying both power and wavelength control over a single laser diode. The application disclosed may be extended to multiple lasers.

Reference is now made to FIG. 2 illustrating a generic embodiment of this invention. In FIG. 2, the optical transmitter 10 comprises a laser diode 12 and includes, in optical alignment therewith, a front facet PD 14 and a rear facet PD 16. Laser 12 may be, for example, a DBR laser or a DFB laser. In connection with the practice of this invention relative to other applications, the light source could also be an LED or a superluminescent laser or a non-semiconductor type laser. PDs 14 and 16 may be any type of photodetector, such as a photodiode, for example, a PIN photodiode or an avalanche photodiode (APD) that have a fairly wide spectrum response. As shown in FIG. 2, laser 12 is a DML where a GHz modulated signal source 18 provides a data signal to modulate laser 12 such as at data rate of 2.5 GHz per second or 10 GHz per second. Alternatively, laser 12 may be operated CW (continuous wave) and an external electro-optic modulator 20 may be employed for signal modulation, such as an electro-absorption modulator (EAM) or a Mach-Zehnder modulator (MZM). Such an external modulator is then modulated from a modulation data source 18A.

Electro-optic components 12, 14, 16 and 20 in FIG. 2, as presented by dot/dash line or configuration 22, may be discrete semiconductor or crystalline devices, as known in the art, or may, in part, be integrated on the same semiconductor substrate, or all may be integrated on the same semiconductor chip forming a photonic integrated circuit (PIC). Also, for the sake of simplicity, only one optical transmitter and signal channel with a modulated signal output on output line 24 is shown. However, it should be noted that multiple of such signal channels, whether in discrete device form or formed in a single PIC chip with other different output channels, may be utilized in the practice of this invention. Thus, FIG. 2 is representative of one such optical transmitter signal channel. In a case of multiple signal channels, all the trains of devices or integrated components 22 would be operated at different output channel wavelengths with, in addition, an optical combiner to combine the modulated channel outputs into a single output signal, which we also refer to as an optical channel group or OCG signal, which would be provided on output line 24. It should be realized that, from a practical point of view, the practice of this invention may not normally be carried out with the deployment of two PDs 14 and 16 relative to power monitoring of a single laser source because, in the case of just one laser source, there are other simplifier ways to the detect the average output power from the front or business end of the laser, of course, not requiring the application of a frequency tone. However, a frequency tone modulator 34 is shown in order to illustrate the basic principal of this invention. This single laser embodiment of FIG. 2 is still valid and illustrates, in a simplistic manner, the basic concept of this invention. In this regard, it can be realized that where there are more than one laser transmitters with their modulated output channel signals multiplexed as a single output signal, the determination of the average power output of each signal channel from the single multiplexed OCG output becomes a greater challenge and of higher utility relative to the application of this invention as will be seen later relative to the description of the embodiment shown in FIG. 4.

The remainder of FIG. 2 relates to a closed loop feedback system for accurately determining the average output power of the laser 12. Also, shown is a wavelength locking system to maintain the peak wavelength of laser 12 on a grid wavelength point of a predetermined or standardized wavelength grid, such as the ITU grid. The photocurrent output of rear facet PD 16 is connected to a digital signal processor (DSP) 26. Also, the photocurrent of front facet PD 14 is connected to DSP 26. DSP 26 includes a memory 28 which includes data relating to factory settings pertaining to the operation of laser 12 such as the bias current setting for laser 12 to provide a desired output power level at a given operational wavelength. Through the control of DSP 26, an appropriate DC bias current is applied from DC bias source 32 to laser driver circuit 30 and a low frequency tone from tone modulator 34 is superimposed on the DC bias current via laser driver circuit 30. The superimposed signal from laser driver 30 is applied to laser 12.

Both the front PD 14 and rear PD 16 will detect the laser output over the life of the laser. The power from the front facet and from the rear facet of laser 12 may be proportional to one another and it is hoped that the proportionality remains constant over the life of laser 12. However, if that proportionality constant does change, the proportionality constant will equally affect the AC part of the optical output induced by the low frequency tone as well as the DC part induced by the set bias above laser threshold. When the ratio of the AC part is taken with the DC part (the AC part having a portion of the total DC part), meaningful information in the form of the optical modulation index (OMI) can be obtained which may be employed to determine the real or actual average power out of the laser front facet. Thus, rear PD 16 provides information about the AC peak-to-peal swing or amplitude value as well as the average DC value of the rear facet optical output. This information may be employed to calibrate DC bias source 32 and or low frequency tone modulator 34 to be the correct relationship relative to one another, i.e., to maintain the desired proportionality constant between these two values or their ratio, i.e., the OMI.

In FIG. 2, it should be noted that in the case of other optical or electro-optical components in the laser output signal channel path of laser 12 that includes, for example, external modulator 20, front PD 14 may alternatively be placed on the downstream or output side of modulator 20 rather between laser 12 and modulator 20 as shown in the figure. Furthermore, front PD may be placed outside the configuration 22 altogether as seen by the dash line representation of PD 14A. PD 14A is coupled to tap 36 to receive a portion of the modulated output on line 24, such as, for example, 2% or less, and converts this output into a photocurrent for signal processing by DSP 26. Thus, it may be that the position of interest in controlling the front output power of laser 12 in the transmitter signal may be as received outside of transmitter configuration 22 rather than directly at the front facet of laser 12. This is done in order to take into consideration the optical attributes that may be affecting the signal on output line 24 due to other optical or electro-optic components within the signal channel path, such as modulator 20, which provides a certain amount of insertion loss and other nonlinearity losses. By knowing the amount of loss incurred, driver biased current changes can be made to laser 12 to insure a desired output power level is attained on line 24 as well as possibly indicating changes to the bias level, for example, of external modulator 20.

Thus, it will be noted that, by detecting the light only from the rear facet of laser 12 via PD 16, there is no guarantee that this light is proportionally the same power emitted from the front facet of laser 12 or at the transmitter output on line 24. Thus, with the deployment of external PD 14A, a determination can be made that a compensating step should be made due to changes in the light output on line 24 versus the calibration provided with the deployment of rear PD 16 which does not experience these light changes that are experienced by the front end output. Such a compensating step may be a change to the bias or operating temperature of laser 12, a change in the bias level of external modulator 20 or the deployment of a VOA (not shown) in configuration 22 at the output of modulator 20 to attenuate the output of laser 12 over life where, for example, the negative bias of the attenuator is decreased over time as laser 12 ages with increasing current threshold and corresponding lower output power.

The embodiment of FIG. 2 also includes a feedback loop control for stabilizing the operating wavelength of laser 12 as known in the art. See, for example, the wavelength control system as seen in FIGS. 1A and 8A of U.S. Pat. No. 6,501,773 as well as U.S. patent application Ser. No. 10/317,935 and, in particular, FIGS. 37 and 38, and U.S. patent application Ser. No. 10/267,330 or its publication No. 2003/0095736, published May 22, 2003 and, in particular, FIGS. 1 and 9, all of which are incorporated herein by their reference. In FIG. 2, a portion of the modulated output signal on line 24 is tapped off at tap 37 to spectrum monitor 38 which filters out the wavelength of interest, i.e., the operating wavelength of laser 12. Controller 39 includes an O/E circuit and provides an error value based on the determined wavelength value of the output signal and a predetermined desired wavelength value for the operational wavelength of laser 12 and then provides an appropriate correction signal on line 35 to laser 12 readjust its operational wavelength to the predetermined wavelength value. As seen from the foregoing incorporated wavelength locking systems, the correction signal may change or adjust the operating temperature of laser 12 or the laser bias current to change, in either case, its operating wavelength to the predetermined desired operational wavelength. It can be seen, then, that changes in laser wavelength may also change the laser output power so that additional adjustments may be required to readjust the laser output power to a desired power level via the feedback power control system of FIG. 2.

Figure 3:
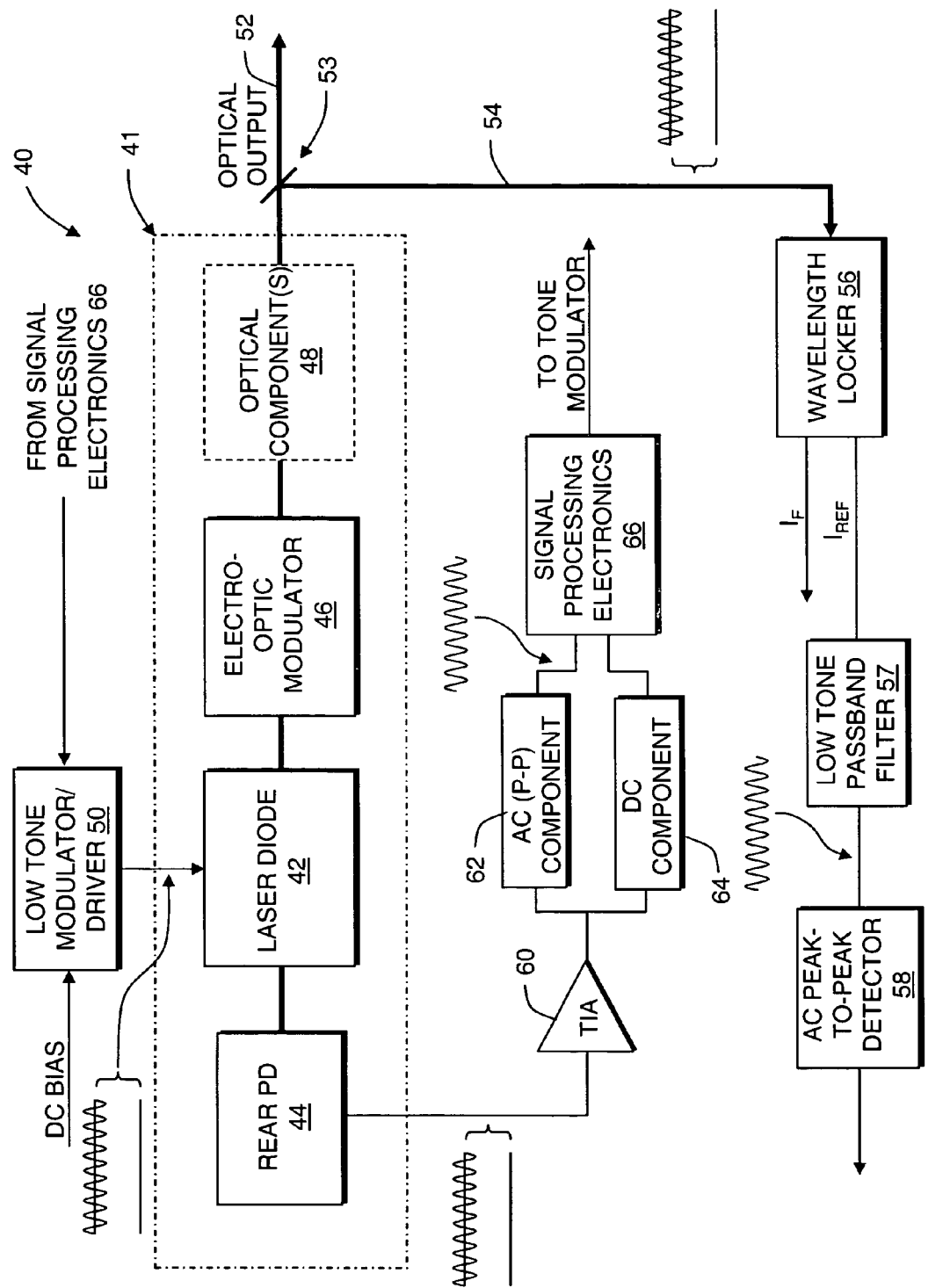
FIG. 3 is a more detailed schematic illustration of a specific embodiment of this invention relative to the embodiment shown in FIG. 2.

Reference is now made to FIG. 3 which is a more detailed version of an embodiment in connection with the more generic embodiment shown in FIG. 2. Optical transmitter 40 comprises a transmitter configuration 41 that includes laser diode 42, rear PD 44, external electro-optic modulator 46 and possibly one or more other optical components 48 in the transmitter optical signal channel or path, such as, for example, an SOA, VOA or a photodetector. Configuration 41 may be comprised of discrete components 42, 44, 46 and 48, or may comprise some of these components integrated with one another, or totally integrated on the same substrate as a monolithic component group comprising a PIC chip. Laser 42 is operated CW and is provided with an appropriate bias current superimposed with a low tone frequency such as, for example, in the KHz frequency range, which tone is provided from tone modulator/laser driver 50. Such a low frequency regime will not interfere with the modulated data signal provided at modulator 46 which is in the GHz frequency range. As in the case of FIG. 2, the embodiment of FIG. 3 may include a plurality of configurations 41 which are multiple discrete trains or channels of elements 42, 44, 46 and 48 or such trains or channels of elements are integrated in a single photonic integrated circuit (PIC).

The photocurrent detected at rear PD 44 is changed to a voltage and amplified via transimpedance amplifier (TIA) 60 where this electrical signal is split to separate the AC part of the signal from the DC part of the signal. The AC peak-to-peak component of the signal is filtered out by circuit 62 and is provided to signal processing electronic 66. The DC component of the signal is filtered out by circuit 64 and is provided to signal processing electronics 66. Signal processing electronics 66 may provided different options relative to these two ascertained component signals. One approach is to electronically process only the AC part of the signal to determine the modulation depth of the applied low frequency tone. Circuit 66 then provides feedback signal modulator/driver 50 that maintains the modulation depth of the low frequency tone to be constant. Thus, a set value for the frequency tone is a percentage of the total applied bias to laser 42, such as in the range of about 0.1% to about 10%, of the total applied bias applied to laser 12. The actual modulation depth can be determined by circuit 66 from the AC part received from circuit 62 and a difference from the desired modulation depth in terms of percentage to the total applied bias can be provided in a closed loop feedback signal to driver 50 to adjust the modulation depth of the superimposed low frequency tone. Thus, the modulation depth can be continuously calibrated to be a constant value over time.

Another approach is to control the OMI to be a constant value. The OMI of the low frequency tone can be maintained constant so that the AC peak-to-peak swing or modulation depth of the tone is maintained constant as well as the average power applied to laser 42. If the modulation depth and the total average power are maintained constant, then the OMI will be constant since it is the ratio of these two values. Thus, circuit 66 electronically processes the ratio of the output of circuit 62 over the output of circuit 64, to produce a value representative of the OMI which can be compared to a predetermined desired OMI value and the difference provided in the feedback loop to make corrections to the OMI value at laser driver 50. Also, the calibrated OMI value may be employed in conjunction with the detection of the AC peak-to-peak swing or amplitude value at output line 52 of the low frequency tone to ascertain the average output power of laser 42 as will be seen in connection with the description further on herein.

Either of foregoing described approaches is valid for calibrating the low tone frequency applied by driver 50 to laser 12.

Two photodetectors are employed in transmitter 40 to accurately determine the output power of laser 42 in the presence of components 46 and 48 in the optical signal channel or path which may affect the resultant output power on output line 52. The one PD 44 is at the rear facet of laser 42 and the other front end PD is within wavelength locker 56 which receives a tapped portion, via tap 53, of the modulated signal on output line 52 which also includes the frequency or modulated tone. The internal content of wavelength locker 56 is known in the art and may be similar, for example, to the configuration shown in FIG. 8B of U.S. Pat. No. 6,501,773, supra, which patent is incorporated herein by its reference. In particular, the modulated signal on feedback line 54 is provided to a beam splitter in locker 56 which optically couples a first part of the beam to a first PD, which is a reference photodetector, and a second part of the beam to a frequency discriminating optical element, such as, for example, an etalon, a grating filter, a diffraction grating or a complex filter, followed by a second PD. For example, the complex filter may have a ramp transmission function dependent on the input frequency or frequencies within a given frequency spectrum. In this regard, such a filter would have better application where more than one channel wavelength or frequency is involved so that, for example, the first laser operational wavelength, $\lambda_1$, may appear at the low end of the filter transmission ramp and the last laser operational wavelength, $\lambda_N$, may appear at the high end of the filter transmission ramp. Also, in the case of multiple wavelengths, the frequency discriminating element may be comprised of multiple grating filters each having a different peak wavelength transmission band or a diffraction grating may be employed to separate out the different respective operational wavelengths of plural transmitter lasers.

The two photodetectors within wavelength locker 56 provide respective photocurrents where the first PD provides a photocurrent, $I_{REF}$, which is "raw" output from line 52 ignorant of wavelength or frequency content of the output signal and includes the output of the frequency of interest, i.e., the low tone frequency, as well as the laser operating frequency. The second photocurrent, $I_F$, is frequency dependent having been passband filtered by the frequency discriminating element in wavelength locker 56 which is, in the case here, the operating frequency of laser 42.

Relative to detecting output power, the signal, $I_{REF}$, is the only signal of the two output signals from wavelength locker 56 that is required for determination of average output power. Signal, $I_F$, as well as signal, $I_{REF}$, are together employed to stabilize the wavelength operation of laser 42 as is known in the art, such as suggested and disclosed in the incorporated U.S. Pat. No. 6,501,773, supra. Thus, the signal, $I_{REF}$, from wavelength locker 56 in the embodiment of FIG. 3 is performing double duty as a reference output for wavelength locking as well as for average output power determination. Only the latter is considered in this disclosure since it pertains to the invention as set forth in the appended claims.

In connection with output power determination, electrical signal, $I_{REF}$, is first processed via low tone passband filter 57 which comprises an electronic narrow passband filter that permits only the transmission spectrum of the low frequency tone or selected tones, as the case may be. The captured tone is processed by an AC peak-to-peak detector 58. The general functionality of detector 58 may be a phase multiplier and a low pass filter to provide a DC value or other value of the low frequency tone which represents an optimum estimation of the AC peak-to-peak swing or modulation depth of the tone. Knowing the OMI via PD 44 and the value of the AC tone at optical output line 52, the total average output power of laser 42 over time can be easily determined. Thus, the circuitry components 57 and 58 provide a signal processing means for isolating the frequency tone or tones of interest, as the case may be, and performing a detection as to the strength of the tone as represented by the magnitude of a DC value corresponding to the AC peak-to-peak swing or modulation depth of the tone as tapped from the optical feedback from output line 52.

Reference is now made to FIG. 4 which discloses another embodiment of this invention. The embodiment is FIG. 4 differs from the previous embodiment in that there are a plurality of transmitter lasers each having a different operational wavelength. Optical transmitter 70 of FIG. 4 comprises an optical transmitter photonic integrated circuit (TxPIC) chip 72 of the type disclosed in the previously identified and incorporated patent applications of the common assignee herein. Chip 72 provides, in monolithic form, a plurality of modulated information or data signals which are multiplexed together to form a single multiplexed or OGC signal in an optical transmitter module employed in an optical transmission network. The version of the TxPIC chip 72 shown here comprises an array of DFB lasers 74(1), 74(2), . . . 74(N), each operating at a different wavelength on a predetermined or standardized wavelength grid, such as the ITU grid. The light output of the CW lasers 74 are respectively coupled and integrated with a modulator 76(1), 76(2), . . . 76(N). The modulated outputs of modulators 76 are optically coupled and integrated respectively with a front PD 78(1), 78(2) . . . 78(N). PDs 78 are optional and may be replaced with another electro-optic component as previously mentioned in connection with the previous embodiment. PDs 78 may function as front monitoring photodiodes of the modulator outputs, or function as attenuators relative to adjusting the power output from modulators 76, or function to receive as specific frequency tone (termed here as "high" frequency tones in comparison to "low" frequency tones provided by generators 88, but not anywhere near as high as channel signal modulation frequency rates) that functions as an identification tag for each laser 86 and its corresponding channel signal. The different tag tones are provided to each of the PDs 78 from multiple tone generator 79. The main purpose of the tag tones is for deployment in wavelength locking and separating out the different operational wavelengths of each of the laser in a feedback loop. Any one of the previously mentioned electro-optic components 78 may be employed to perform this tagging function.

The multiple modulated outputs from PDs 78 are multiplexed together by an optical combiner which is shown here as arrayed waveguide grating 82 which is also integrated on the same chip 72. The multiplexed signal output is provided on output waveguide 84 of TxPIC chip 72. Chip 72 also includes an array of integrated rear facet monitoring PDs 80(1), 80(2), . . . 80(N) for each respective laser 74(1), 74(2), . . . 74(N).

Each laser 74 is provided with a local heater 86(1), 86(2), . . . 86(N) which may be a heater strip. Also, each laser includes a bias contact 87(1), 87(2), . . . 87(N) for externally applying a bias current to respectively drive lasers 74.

DFB lasers 86(1), 86(2), . . . 86(N) may be coupled, respectively to receive a low frequency tone of a different frequency from tone generators 88(1), 88(2), . . . 88(N) which low frequency tones are superimposed on the bias current applied to each laser via bias contacts 87(1), 87(2), . . . 87(N). The low tone frequencies from low tone generators 88 are in a different frequency spectrum from the high tone frequencies generated by high frequency tone generator 79. The frequency spectrum separation of these tone groups are sufficiently separated from one another so that the respective tone groups can be easily be filtered from one another in a feedback system. For example, the low frequency tones provided by generators 88 may be several tens of KHz range whereas the high frequency tones provided by generator 79 may be in the several hundreds of KHz range. Also, it should be realized that while different tone groups are disclosed for different tagging functions, channel wavelength locking and channel power monitoring as well as channel power equalization (pre-emphasis), it is within the scope of this invention that a single set of tones, i.e., either set of high or low frequency tones as disclosed herein, may be employed for the purpose of both identifying signal channels 1 through N for purposes of both wavelength stabilization as well as power monitoring, optical attribute detection and/or correction, and equalization. For example, the single set of tones as applied via generators 88 may be used for the purpose of both wavelength locking as well as power monitoring and correction as well as power equalization across the N signal channels. It is submitted that the preferred approach is to employ only one set of tones since the elimination of the other set of tones would reduced the required electronic processing circuits leading to less complex and inexpensive loop feedback systems as well as eliminate one less functional requirement imposed upon front PDs 78. Such a single tone deployment for both wavelength stabilization and output power stabilization is already illustrated in the previous embodiment of FIG. 3. However, there may be reasons to provide different tones for different functions, i.e., one set of tones for power monitoring and power level changes relative to each signal channel and another set of tones for wavelength determination which are indicative of required operational wavelength adjustment relative to each signal channel laser.

The output at 84 of TxPIC chip 72 is coupled to output line 90 which may be comprised of a communication fiber. A portion of the multiplexed output signal on line 90 is optically tapped at respective taps 92 and 96. The portion of the signal tapped at 92 is received at power controller module 94 which takes the light signal and converts it into a photocurrent. This photocurrent represents all of the modulated tones from lasers 74(1), 74(20), . . . 74(N), along with other tones and data modulated frequencies present in the same output signal, where the laser modulated tones can be respectively employed to determine the strength of the output power from each of the lasers 74. In module 94, each of these tones are filter out employing a plurality of electronic passband filters with a passband spectrum response covering all of the low frequency tones. All other frequencies are thus stripped away. Then, the passband of tones is applied to a plurality of individual filters each with a passband peak at one of the respective low tone frequencies. As a result, N tones will have been separated into N number of AC peak to peak tone signals which are respectively passed through an AC peak-to-peak detector, as explained earlier herein, to provide respective output values representative of the strength, i.e., the amplitude or modulation depth of each AC tone for each respective laser 74. The respective output values of each of these tones are proportional to the optical modulation index (OMI) relative to each respective laser times the average power of each laser 74. Thus, knowing the OMI via the rear PDs 80 and the amplitude value or strength of the tones at output line 90, the average output power of each of the respective lasers 74 can be readily determined for each of the signal channels in the combined channel signal output on line 90. This information is then employed to readjust the average power of the individual lasers 74 as well as may be employed to provide pre-emphasis by employing front PDs 78(1), 78(2), . . . 78(N) as power attenuators to equalize the output powers across the output array of lasers 74. In this pre-emphasis scheme, lasers 74 are initially, at the beginning of life, operated at a higher power output, i.e., above the power level necessary or required as an appropriate power output level for all of the N signal channels but still within the designed allowable operating range of lasers 74. The PDs/VOAs 78 are bias adjusted accordingly to reduce the signal channel power level to an appropriate individual power level while also adjusting those output levels to be substantially equalized across the laser array. As TxPIC chip 72 ages and the current thresholds of lasers 74 correspondingly increase with a corresponding decrease in their output power due to such aging, the applied negative bias on PDs/VOAs 78 is corresponding reduced to return the output levels of the aging lasers to desired power output levels at output line 90.

It will be understood by those skilled in the art that power level adjustment may be accomplished by other ways rather then the use of front PDs 78 as attenuators. For example, the outputs from module 94 may be employed to increase the bias current on lasers 74 to increase their power output to the appropriate power output level as these lasers age. This, in turn, will require the deployment, for example, of heaters 86 to readjust the operational wavelengths of the respective lasers 74 as may be required.

Also, shown in FIG. 4 is wavelength controller module 98 that operates in the same manner as explained, for example, in connection with wavelength locker 56 FIG. 3, except that that in module 98 all of the photocurrent representation of frequencies relative to the tapped portion of the signal from output line 90 at tap 96 is stripped away except for the content of the high tone frequencies which are separated out in a manner as previously explained in connection with the embodiment in FIG. 3 relative to one such tone as well as exemplified in the previously cited references.

As previously indicated, the wavelength control can be accomplished with the use of either set of tones 79 or 88. These tones allow electrical spectral signal processing in identifying the presence or absence of tones in the developed photocurrent in the output of chip 74 provided to power controller module 94, which tones are then electrically separated out and individually processed to determine either the wavelength or the average power that was in the respective channel signals bearing a respective tone. The region of the frequency spectrum where these tones exist in the photocurrent developed from the optical output from line 90 is isolated using a passband filter. The amplitude of each of the respective tones is determined over time to provide a value indicative of their tone strength, i.e., their amplitude or modulation depth value, which is a directly related to the respective channel signal output powers on line 90, knowing the OMI of each of the lasers 74 through the deployment of rear PDs 80 where the OMI of each signal channel is calculated and calibrated as explained in conjunction with the single tone example set forth in FIG. 3. The amplitude or modulation depth of the respective tones can also be accomplished by performing a fast Fourier transform of the signal which will reveal the tone frequencies and the magnitude of each tone. Alternatively, the photocurrent developed in module 94 may be converted into a voltage, electrically amplified and split with an electronic signal splitter into a plurality of separate signals and thereafter each such signal is passed through individual N passband filters whose center frequency is the respective tone of interest for each of N channels.

Thus, according to this invention, optical performance information is available on a per-channel basis through rear facet PDs 80 together with an induced tone modulation on each of the lasers 74 at a different tone frequency allowing for a calibrated measurement over time, such as over the lifetime of lasers 74, of an optical attribute of each laser which can be employed in signal processing with the aid of another PD that simultaneously senses all of the combined channels signal wavelengths and laser tones in combined channel signal output on line 90 from chip 72 and permits the accurate inference or estimation of the optical channel signal power through monitored strength of the respective tones in the combined output. The detected optical attribute may be the OMI or the AC peak-to-peak swing or modulation depth detected via each respective rear PD 80.

In connection with each signal channel, if the OMI measured at rear PDs 80 for each signal channel is known, then the measurement of the OMI at the back PDs can be unambiguously related to the detected AC peak-to-peak swing or amplitude reaching the front detector in module 94 to determine the average power per signal channel over time since the AC amplitude of each channel tone is equal to the product of the channel OMI and average power per channel reaching the external PD, i.e., the single PD associated with a small portion of the multiplexed signal output on line 90 s directed to module 94 via tap 92.

In summary, the present invention relates to the accurate determination of the average power, for example, from a laser transmitter on a per signal channel basis with the application of rear and front PDs together with an induced modulation on the laser for the purposes of optical detection of the low frequency tone to allow a calibrated measurement to be made of an optical attribute of the laser over the lifetime of the laser, which attribute can be used in signal processing with the aid of the front PD to determine the actual average output power of the laser in spite of the presence of various optical impairments in the output light that may hide or obscure the real value of the laser output power. Such optical attributes comprise a determined value based on the AC laser tone peck-to-peak swing or modulation depth or on the determined optical modulation index (OMI). The optical impairments may be insertion losses among the optical components or waveguides aligned in the laser output path as well as other effects such as electro-optic losses due to operation of electro-optic components aligned in the optical output path of the laser.

While the invention has been described in conjunction with several specific embodiments, it is evident to those skilled in the art that many further alternatives, modifications and variations will be apparent in light of the foregoing description. For example, this invention has been illustrated relative to the deployment of semiconductor lasers or laser diodes. However, the principal of this invention in accurately determining the average output power of laser at the business or customer end can also be applied to other types of lasers and light sources (such as LEDs, superluminescent lasers or gas lasers, for example) as well, and regardless, in all cases, as to whether or not the laser or lasers are being utilized in optical transmission systems or in other applications where the output power from the front or "customer" end output of the laser is desired to be accurately determined. Thus, the invention described herein is intended to embrace all such alternatives, modifications, applications and variations as may fall within the spirit and scope of the appended claims.

What is claimed is:

1. A monitoring method, comprising the steps of:
    superimposing a frequency tone on a bias current to generate a modulation current;
    modulating a laser in accordance with the modulation current to generate a first optical signal output from a first facet of the laser and a second optical signal output from a second facet of the laser;
    detecting a first output power associated with the first optical signal with a first photodiode;
    providing a first detection signal based on the first output power;
    determining a first optical attribute based on the first detected signal;
    transmitting the second optical signal through a second photodiode;
    detecting a second output power associated with the second optical signal with the second photodiode;
    providing a second detection signal based on the second output power;
    determining a second optical attribute based on the second detection signal; and
    determining an average output power associated with the second optical signal based on the first and second attributes,
    wherein said first optical attribute is an optical modulation index (OMI) of the frequency tone and the second optical attribute is a modulation depth.

2. The method of claim 1 wherein the modulation depth of the frequency tone is a predetermined percentage of the bias current.

3. The method of claim 2 wherein the predetermined percentage is in a range of about 0.1% to about 10%.

4. The method of claim 1 comprising the further step of calibrating the modulation depth to be a predetermined percentage of the bias current.

5. A monitoring method in accordance with claim 1, further including a step of modulating the second optical signal with an external modulator.

6. A monitoring method in accordance with claim 5, wherein the external modulator is a Mach-Zehnder modulator.

7. A monitoring method in accordance with claim 1, wherein the first and second photodiodes are integrated on a common substrate.

8. A monitoring method in accordance with claim 1, wherein the first and second photodiodes are discrete components.

* * * * *